United States Patent
Prabhakar et al.

(10) Patent No.: US 10,122,382 B2
(45) Date of Patent: Nov. 6, 2018

(54) VSS LDPC DECODER WITH IMPROVED THROUGHPUT FOR HARD DECODING

(71) Applicant: SK hynix Inc., Gyeonggi-do (KR)

(72) Inventors: Abhiram Prabhakar, Fremont, CA (US); Johnson Yen, Fremont, CA (US); Ngok Ying Chu, Los Altos, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/269,686

(22) Filed: Sep. 19, 2016

(65) Prior Publication Data

US 2017/0085276 A1    Mar. 23, 2017

Related U.S. Application Data

(60) Provisional application No. 62/220,880, filed on Sep. 18, 2015.

(51) Int. Cl.
| | |
|---|---|
| *H03M 13/11* | (2006.01) |
| *H03M 13/37* | (2006.01) |
| *H03M 13/09* | (2006.01) |
| *G06F 11/10* | (2006.01) |
| *G11C 29/52* | (2006.01) |
| *H03M 13/29* | (2006.01) |

(52) U.S. Cl.
CPC ..... *H03M 13/1108* (2013.01); *G06F 11/1012* (2013.01); *H03M 13/1111* (2013.01); *H03M 13/1122* (2013.01); *H03M 13/2906* (2013.01); *H03M 13/3707* (2013.01); *H03M 13/3723* (2013.01); *H03M 13/09* (2013.01)

(58) Field of Classification Search
CPC ........... H03M 13/1108; H03M 13/096; H03M 13/1111; H03M 13/1122; H03M 13/2906; H03M 13/3707; H03M 13/3723; H03M 13/3746; H03M 13/03; H03M 13/09; G06F 11/1012; G06F 11/1068
See application file for complete search history.

(56) References Cited

U.S. PATENT DOCUMENTS

| | | | |
|---|---|---|---|
| 8,341,506 B2 | 12/2012 | Li et al. | |
| 9,048,870 B2 | 6/2015 | Li et al. | |
| 2004/0034828 A1* | 2/2004 | Hocevar | ............ H03M 13/1114 714/800 |
| 2004/0194007 A1* | 9/2004 | Hocevar | ............ H03M 13/1185 714/801 |
| 2009/0282316 A1* | 11/2009 | Lingam | .................. H03M 13/11 714/763 |

(Continued)

*Primary Examiner* — Kyle Vallecillo
(74) *Attorney, Agent, or Firm* — IP & T Group LLP

(57) ABSTRACT

Memory systems may include a memory storage, a pre-processing checksum unit suitable for, during a first decoding iteration, receiving hard read data including channel input (Lch) sign values, and computing a checksum of the Lch sign values as a checksum_pre value, and a low-density parity-check (LDPC) decoder including an Lch memory and a checksum update unit, the LDPC decoder suitable for, during the first decoding iteration, storing the Lch sign values in the Lch memory of the LDPC decoder, receiving, with the checksum update unit, the checksum_pre value, and decoding a codeword in at least a second decoding iteration based at least in part on the checksum_pre value computed and received being a parity check on the hard read performed in the first decoding iteration.

18 Claims, 11 Drawing Sheets

(56) References Cited

U.S. PATENT DOCUMENTS

2014/0143628 A1\* 5/2014 Li ................... H03M 13/6591
 714/752
2014/0281787 A1\* 9/2014 Wang ................... H03M 13/13
 714/752

\* cited by examiner

50

70

US 10,122,382 B2

VSS LDPC DECODER WITH IMPROVED THROUGHPUT FOR HARD DECODING

CROSS-REFERENCE TO RELATED APPLICATIONS

This application claims the benefit of U.S. Provisional Application No. 62/220,880 filed Sep. 18, 2015, the entire contents of which are incorporated herein by reference.

BACKGROUND

1. Field

Exemplary embodiments of the present disclosure relate to a memory system and an operating method thereof.

2. Description of the Related Art

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

When flash memory devices (e.g., NAND devices) are used for extended time, endurance and retention become larger, and the number of errors in read data increases. Thus, there exists a need for improved systems to maintain decoder throughput as the age of a flash memory device increases.

SUMMARY

Aspects of the invention include memory systems. The memory systems may include a memory storage, a pre-processing checksum unit suitable for, during a first decoding iteration, receiving hard read data including channel input (Lch) sign values, and computing a checksum of the Lch sign values as a checksum_pre value, and a low-density parity-check (LDPC) decoder including an Lch memory and a checksum update unit, the LDPC decoder suitable for, during the first decoding iteration, storing the Lch sign values in the Lch memory of the LDPC decoder, receiving, with the checksum update unit, the checksum_pre value, and decoding a codeword in at least a second decoding iteration based at least in part on the checksum_pre performed in the first decoding iteration.

Further aspects of the invention include methods. The methods may include receiving, with a pre-processing checksum unit hard read data including channel input Lch sign values, computing, with the pre-processing checksum unit, a checksum of the Lch sign values as a checksum_pre value, storing, with a low-density parity-check decoder, the Lch sign values in an Lch memory of the LDPC decoder, receiving, with a checksum update unit of the LDPC decoder, the checksum_pre value, and decoding, with the LDPC decoder a codeword in at least a second decoding iteration based at least in part on the checksum_pre value computed and received being a parity check on the hard read performed in the first decoding iteration.

Additional aspects of the invention include memory devices. The memory devices may include a memory storage, a pre-processing checksum unit configured to, during a first decoding iteration receive hard read data including channel input (Lch) sign values, and compute a checksum of the Lch sign values as a checksum_pre value, and a low-density parity-check (LDPC) decoder including an Lch memory and a checksum update unit, the LDPC decoder configured to, during the first decoding iteration, store the Lch sign values in the Lch memory of the LDPC decoder, receive, with the checksum update unit, the checksum_pre value, and decode a codeword in at least a second decoding iteration based at least in part on the checksum_pre value computed and received being a parity check on the hard read performed in the first decoding iteration.

DETAILED DESCRIPTION

Figure 1:
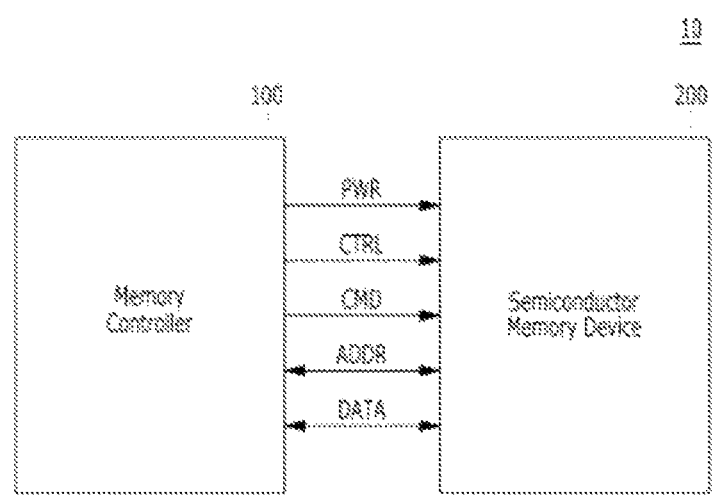
FIG. 1 is a block diagram schematically illustrating a memory system in accordance with an embodiment of the present invention.

Various embodiments will be described below in more detail with reference to the accompanying, drawings. The present invention may, however, be embodied in different forms and, should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general the order of the steps of disclosed processes may be altered within the scope of the invention.

Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

FIG. 1 is a block diagram schematically illustrating a memory system 10 in accordance with an embodiment of the present invention.

Referring FIG. 1, the memory system 10 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid state drive (SSD). The solid state drive may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (DHC), and a universal flash storage (UFS).

For another example, the memory system 10 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RID) device, or elements devices of a computing system.

Figure 2:
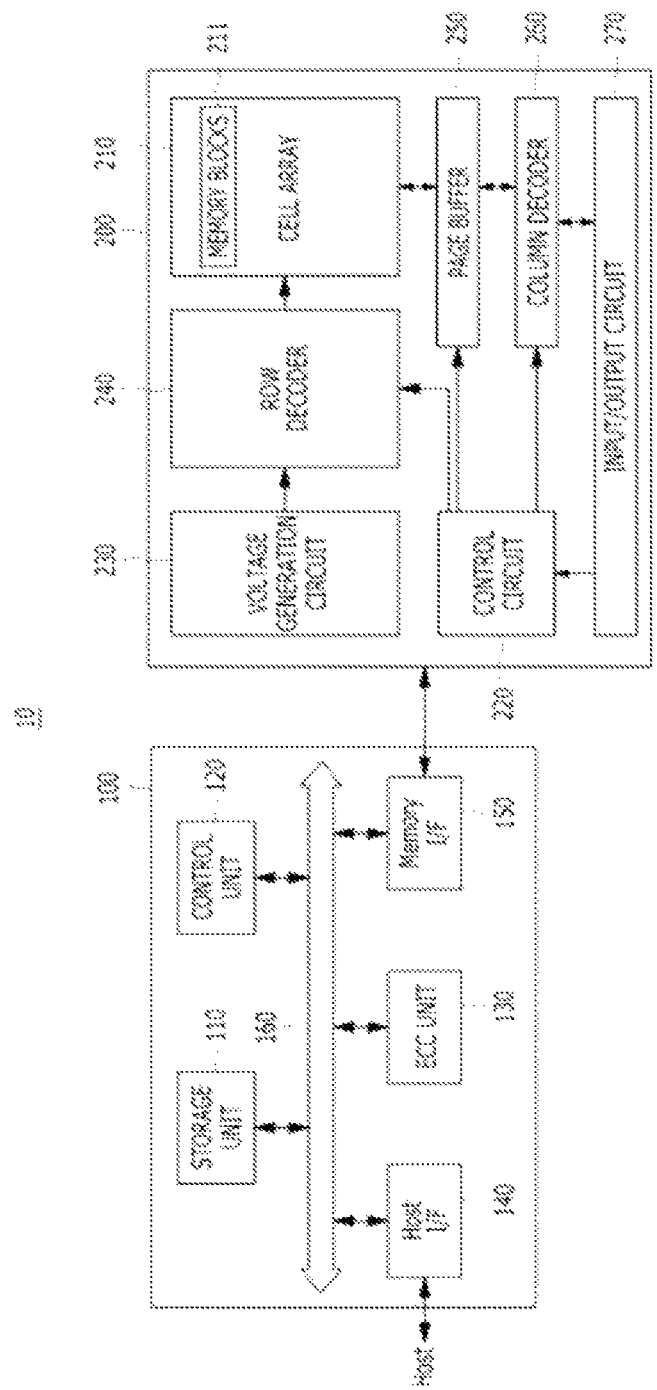
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 shay include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM) an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example, the controller 100 may control the memo device 200 in response to a request from the host device. The controller 100 may provide the data read from the memory device 200, to the host device, and store the data provided from the host device into the memory device 200.

The controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

The control unit 120 may control general operations of the memory system 10, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM) and so on. The ECC unit 130 may include all circuits, systems or devices for the error correction operation.

The host interface 140 may communicate with the host device through one or more of various interface protocols such as a universal serial bus (USB) a multi-media card (MMC), a peripheral component interconnect express (PCI-E), a small computer system interface (SCSI), a serial-attached SCSI (SAS), a serial advanced technology attachment (SATA), a parallel advanced technology attachment (IATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 forma peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g. the memory controller 100), transmit data from the external device to the column decoder 260, or output data from the column decoder 250 to the external device, through the input/output circuit 270.

The control circuit 220 may contra the peripheral cult in response to the command and the address.

Figure 3:
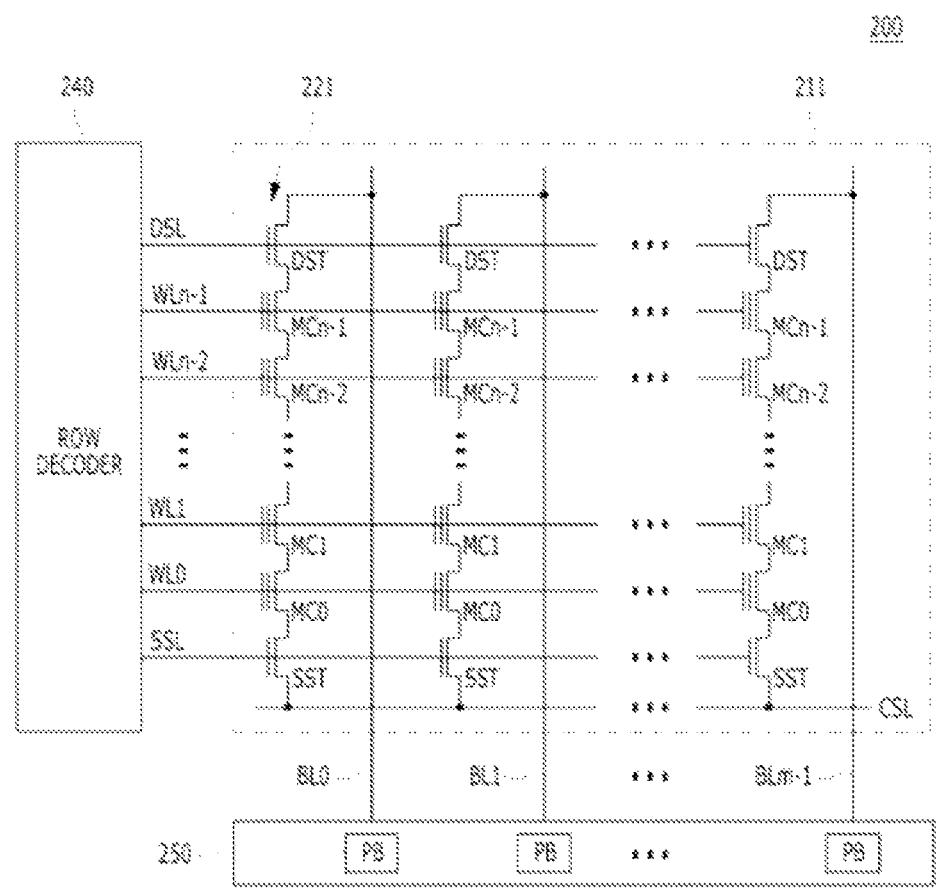
FIG. 3 is a circuit diagram illustrating a memory block of a memory device in accordance with an embodiment of the present invention.

FIG. 3 is a circuit diagram illustrating a memory block of a semiconductor memory device in accordance with an embodiment of the present invention. For example, a memory block of FIG. 3 may be the memory blocks 211 of the memory cell array 200 shown in FIG. 2.

Referring to FIG. 3, the memory blocks 211 may include plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a mufti-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 4:
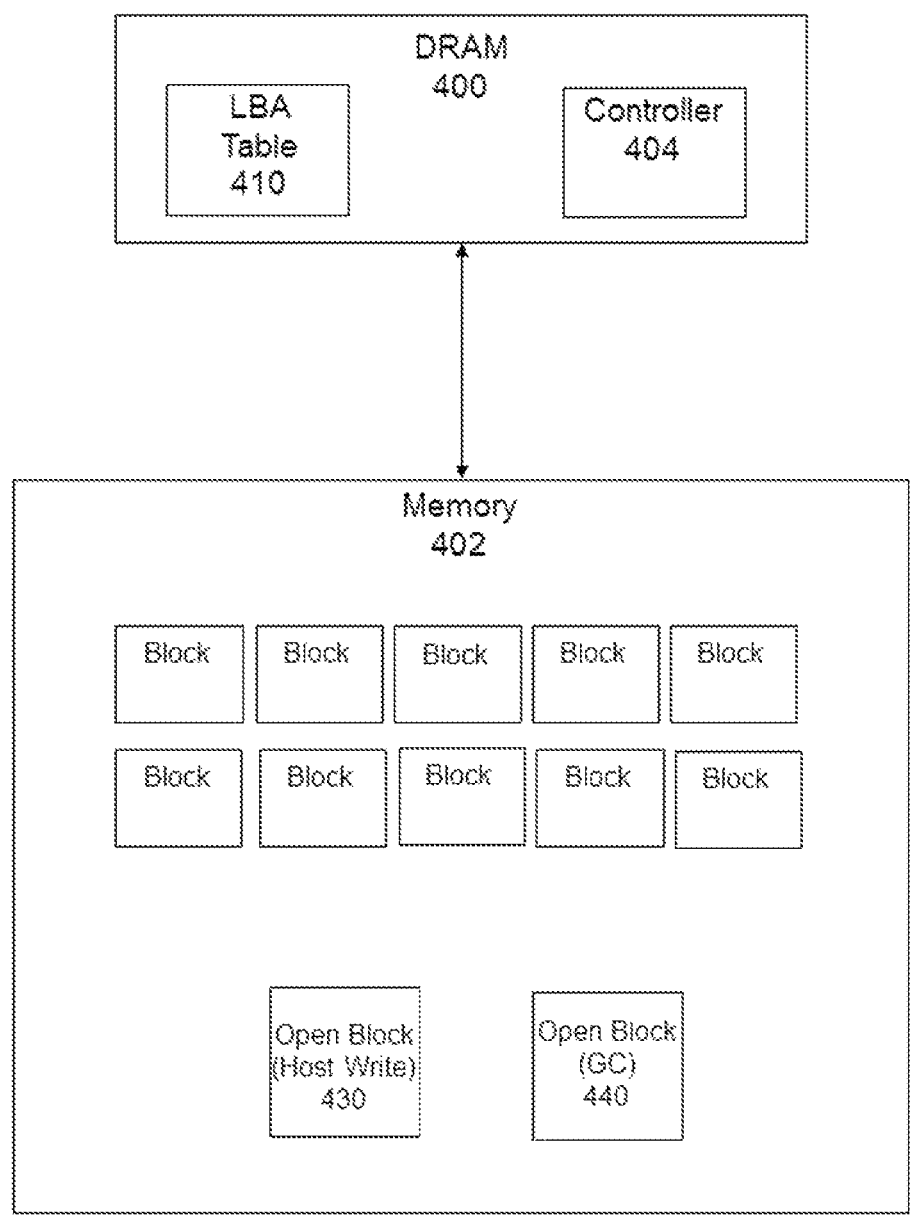
FIG. 4 is a diagram of a memory system in accordance with aspects of the invention.

FIG. 4 is a diagram of an example system 40 for improving and maintaining decoder throughput as a flash memory device approaches end of life. The system 40 may include a DRAM 400 portion (e.g., a volatile portion) and a memory 402 portion (e.g., a non-volatile portion). The DRAM 400 portion and memory 402 portion may be in communication with each other, and may be assembled on a single device or interconnected through multiple devices and/or interfaces. The DRAM 400 portion may include an LBA table 410 for mapping addresses of bits and data, and a controller 404, such as the controllers described above, along with other suitable components as will be understood by those of skill in the art from the disclosure herein. The memory portion 402 may include a plurality of memory blocks (and/or a plurality of super memory blocks), an open block 430 for host writes, an open block 440 for garbage collection, and other suitable block designations as will be understood by one of skill in the art from the description herein.

Disclosed herein are systems, devices, methods, and processes that boost the throughput of a low density parity check (LDPC) decoder (e.g., a VSS decoder and/or other min-sum decoders). LDPC decoder latency may become longer if more error bits are in a codeword. When memory devices (e.g., NAND devices) are used longer (e.g., for longer periods of time approaching end of life-endurance and retention become larger), the number of errors in read data from the NAND devices increases. Thus, as the age of the NAND device increases, more throughput the decoder will be needed. Therefore the systems, methods, devices, and processes disclosed herein maintain (among other features) sufficient decoder throughput as the memory devices approach the end of life to provide sustained performance.

Figure 5:
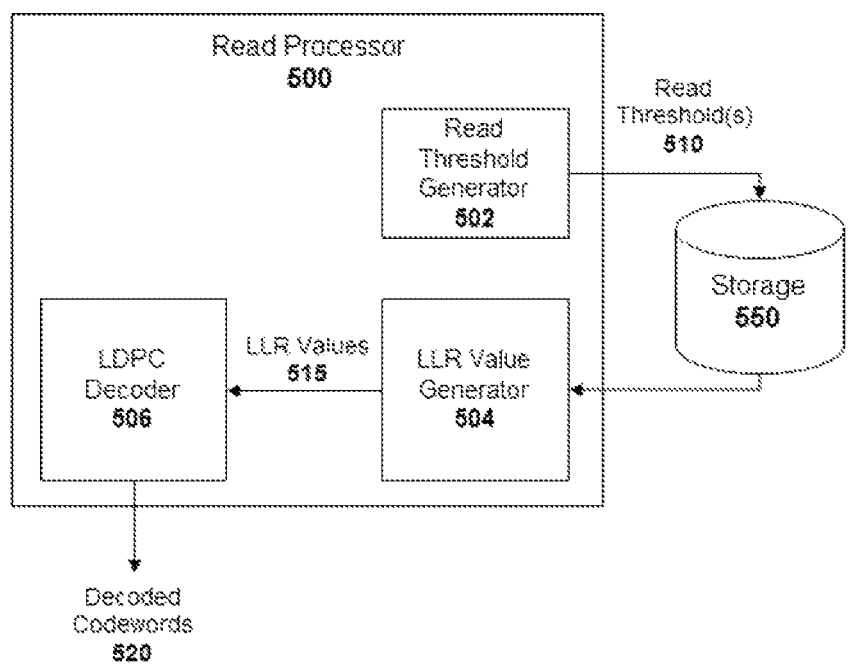
FIG. 5 is a diagram of a memory processor according to aspects of the invention.

FIG. 5 is a diagram of a system 50 illustrating an embodiment of a storage system, including an LDPC decoder. The system 50 may include a storage 550 and a read processor 500. The read processor 500 may additionally include a read threshold generator 502, a likelihood ratio (LLR) value generator 504, and an LDPC decoder 506. The LDPC decoder 506 may be configured as a min-sum LDPC decoder, such as, for example, a VSS min-sum LDPC decoder, although the invention is not limited to only VSS min-sum LDPC decoders or min-sum LDPC decoders.

The read threshold generator 502 may be configured to generate one or more read thresholds 510 which may be used to read from the storage 550. In various embodiments, storage 550 may include solid state storage, hard disk storage, removable storage, NAND flash, 3D NAND, etc. The read thresholds 510 output by the read threshold generator 502 may be used to read a group of N cells (e.g., a page, a segment, etc.) in the storage 550.

Initially, only one read of storage 550 may be performed (e.g., a desired page or segment containing N cells is read). N hard read values corresponding to those N cells may be passed from the storage 550 to the LLR value generator 504.

When the stored data is requested or otherwise desired (e.g., by an application or user which stored the data), the LLR value generator 504 may access the storage 550 and retrieve read data which includes some noise or errors. The LLR value generator 504 may process the read data and output LLR values 515 for each bit. The LLR value generator 504 may provide LLR values 515 to the LDPC decoder 506 for decoding. If decoding is successful at the LDPC decoder 506, then the decoded codeword 520 may be outputted.

Figure 6:
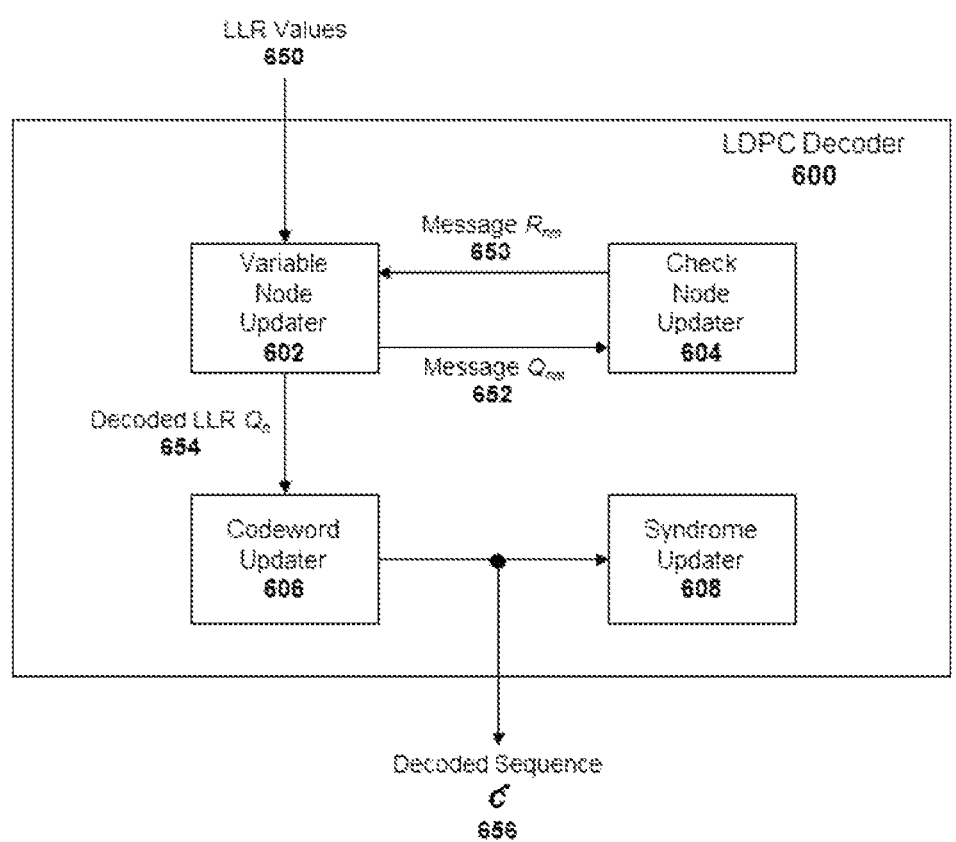
FIG. 6 is a diagram of an example LDPG decoder according to aspects of the invention.

FIG. 6 is a diagram of an example system 60 and, in particular, an example LDPC decoder 600 (e.g., such as a min-sum LDPC decoder). In some embodiments, the LDPC decoder 600 is implemented using a semiconductor devices, such as a field-programmable gate array (FPGA) and/or an application-specific integrated circuit (ASIC). In some embodiments, the LDPC decoder 600 is included in the LDPC decoder 504 described with respect to FIG. 5.

Figure 7:
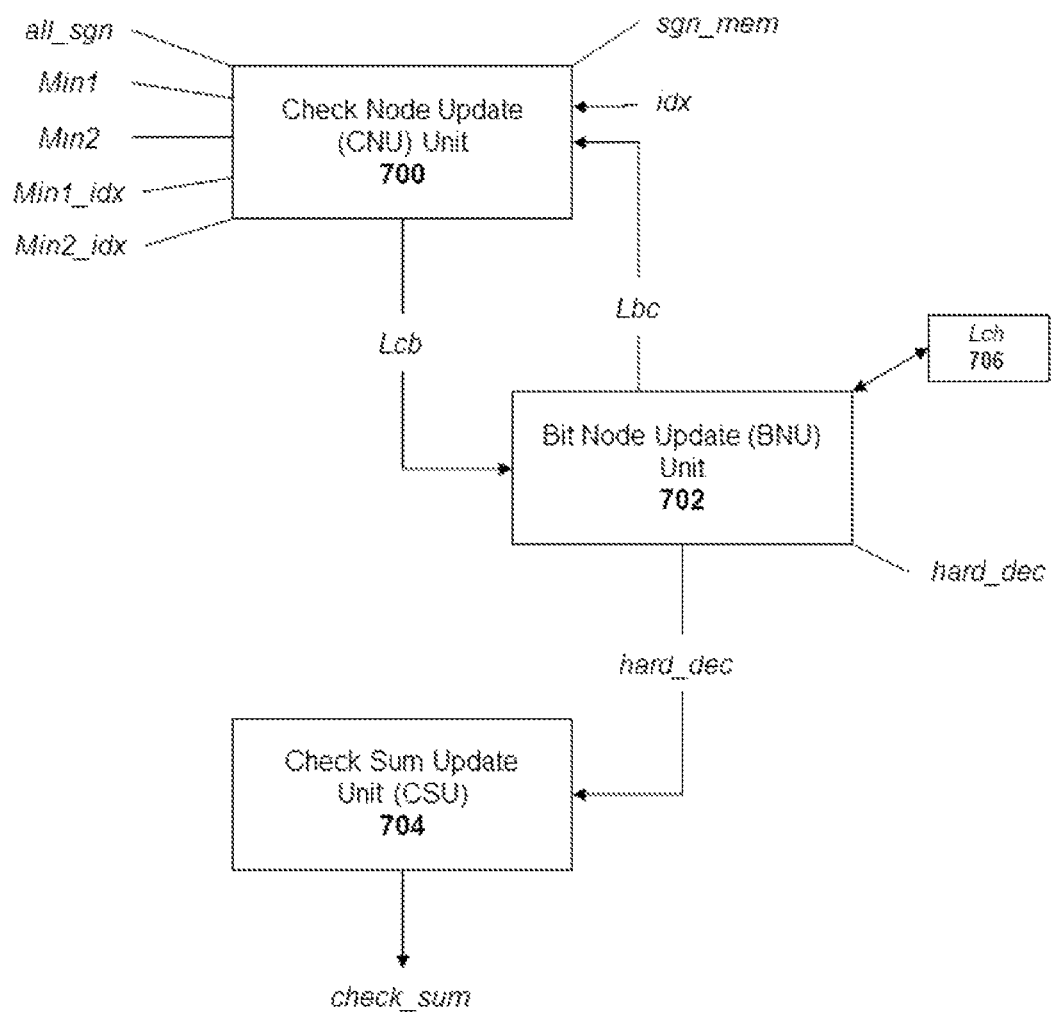
FIG. 7 is a diagram of example component an LDPC decoder in accordance with aspects of the invention.

The LDPC decoder 600 may include a variable node updater 602 (e.g, BNU in FIG. 7) a check node updater 604 (e.g., CNU in FIG. 7), a codeword updater 606, and a syndrome updater 608 (e.g., check sum update unit in FIG. 7).

The variable node updater 602 may be configured to generate a message $Q_{nm}$ 652 (e.g., Lbc in FIG. 7) which is associated with being sent from variable node n to check node m (e.g., from variable nodes to check nodes as described in U.S. patent application Ser. No. 14/444,712 titled "HIGH SPEED LOW-POWER LDPC DECODER DESIGN", the contents of which are incorporated by reference herein) and send the message 652 to the check node updater 604. Such a message 652 may be referred to as "a message which is sent from variable node n to check node m."

The check node updater 604 may be configured to output message $R_{mn}$ 653 (e.g. Lcb in FIG. 7) (e.g., from check nodes to variable nodes) back to the variable node updater 602. A message 653 associated with being sent from check node m to variable node n may be referred to as "a message sent from check node m to variable node n."

In the LDPC decoder 600 shown, an array or sequence of N LLR values 650 (e.g., L=[$L_1$, . . . , $L_N$]) may be input by the LDPC decoder 600 to the variable node updater 602. For example, the LDPC decoder 600 may be used in a storage system and a page or segment containing N cells may be read from storage (e.g., solid state storage, NAND flash storage, hard drive storage etc.). Each of the LLR values 650 may be a soft value where the sign indicates a decision (e.g., a negative sign indicates a 1 and a positive sign indicates a 0) and the magnitude indicates the certainty or likelihood associated with that decision (e.g., a larger magnitude corresponds to more certainty in an associated decision).

In addition to generating $Q_{nm}$ messages 652, the variable node updater 602 may be configured to generate a decoded LLR $Q_n$ for 1≤n≤N. The decoded LLR values 654 may be passed from the variable node updater 602 to the codeword updater 606.

In an example, the codeword updater 606 may be configured to calculate (for 1≤n≤N)ĉ[$ĉ_1$, $ĉ_2$, . . . , $ĉ_N$] using the following:

$ĉ_N$={0 if $Q_n$≥0;1 if $Q_n$<0};

where ĉ represents a decoded sequence 656. In some embodiments, the most significant bit (MSB) bits of the decoded LLR values 654 are sent to the syndrome updater 608 to decide whether decoding is successful or not. Put alternatively, in some embodiments, the codeword updater 606 performs relatively simple processing.

The syndrome updater 608 may be configured to check if all of the errors have been removed from a codeword. For example, if for a parity check matrix H, ĉH=0, then the syndrome updater 608 determines that the decoding is successful and all errors have been removed from the codeword. If so, the LDPC decoder 600 stops decoding and outputs the decoded sequence 656 ĉ=[$ĉ_1$, $ĉ_2$, . . . , $ĉ_N$] as the decoder output.

In some embodiments, if ĉH≠0, the decoded codeword (e.g., ĉ) is not output and another decoding iteration is performed (e.g., the variable node updater 602 may calculate new messages 652 and new decoded LLR values 654, the check node updater 604 may calculate new messages 653, and the codeword updater 606 may calculate a new codeword and check if the product of the new codeword and the parity check matrix is 0, or until some (e.g. predefined) maximum number of iterations is reached).

In examples of the invention, the LDPC decoder such as decoders 504 and 600), as, for example, min-sum LDPC decoders, are configured to perform decoding algorithms. In some embodiments, initializing the decoding algorithm includes initializing a decoding iteration counter. For example, a maximum number of times an LDPC decoding algorithm may be repeated to decode a codeword is selected and a counter that tracks the current iteration number may be initialized to "1" to indicate that currently the first iteration of the LDPC decoding algorithm is being performed. In one example, variable k is the iteration indicator and is initialized as k=1 and $K_{max}$ is initialized as the maximum of iterations allowed to decode one codeword. $K_{max}$ may be preconfigured and/or dynamically determined. In some embodiments, one decoding iteration is completed when all variable nodes and check nodes have been updated at least once during the iteration.

Although the min-sum LDPC decoder may be configured to conduct multiple decoding iterations according to a decoding algorithm, during a first iteration of min-sum decoding, the LDPC decoder does not perform any error corrections. Thus, embodiments of the invention utilize the available resources during the first iteration to improve the throughput of the min-sum LDPC decoder.

In particular, the first iteration of decoding in the min-sum LDPC decoders can improve throughput by conducting a decoding check using hard read data, example LDPC decoder. The system 70 may include a check node update (CNU) unit 700, a bit node update (BNU) unit 702, and a check sum update (CSU) unit 704.

The CNU 700 may be configured to receive bit to check messages (Lbc) (e.g., for a 3-bit decoder, 1 bit may be assigned to the sign and two bits may be assigned to the magnitude), as well as location references (idx) from the BNU 702. The CNU 700 may also include various values that are associated with it. For example, the value all_sgn is a value corresponding to the product of the sign of Lbc messages. Min1 is an absolute value of a minimum magnitude and Min1_idx is a value indicating the location of the magnitude Min1. Correspondingly, Min2 is an absolute value of a second to minimum magnitude and Min2_idx is a value indicate the location of the magnitude Min2.

The CNU 700 may also be configured to output check to bit messages (Lcb) based on a location reference idx and sgn_mem contents. The sgn_mem value may contain/include the sign of the bit to check message (Lbc).

During decoding, several iterations may transpire. There are values that are used from previous decoding iterations as well. For example, the magnitude of the Lcb is Min1/Min2 based on min1_idx and the input location reference idx. The sign of the Lcb is all_sgn*sgn_mem.

The BNU 702 may be configured to receive Lcbs and channel input values (Lch 706). The BNU 702 may use scaling factors and compute Lbc values. In addition, the BNU 702 may be configured to update the hard decisions (hard_dec) (e.g., whether a bit is a 0 or 1), which may then be used by the CSU 704 to check if the data has converged to a codeword and decoding can be stopped.

The CSU 704 receives the hard decisions hard_dec from the BNU 702 and may be configured to calculate the checksum (e.g. the XOR parity of hard decisions) for each parity check. If all the parity checks are zero, the codeword has converged. The CSU 704 may also be configured to output the calculated/computed check sun (e.g., check_sum as depicted).

Figure 8:
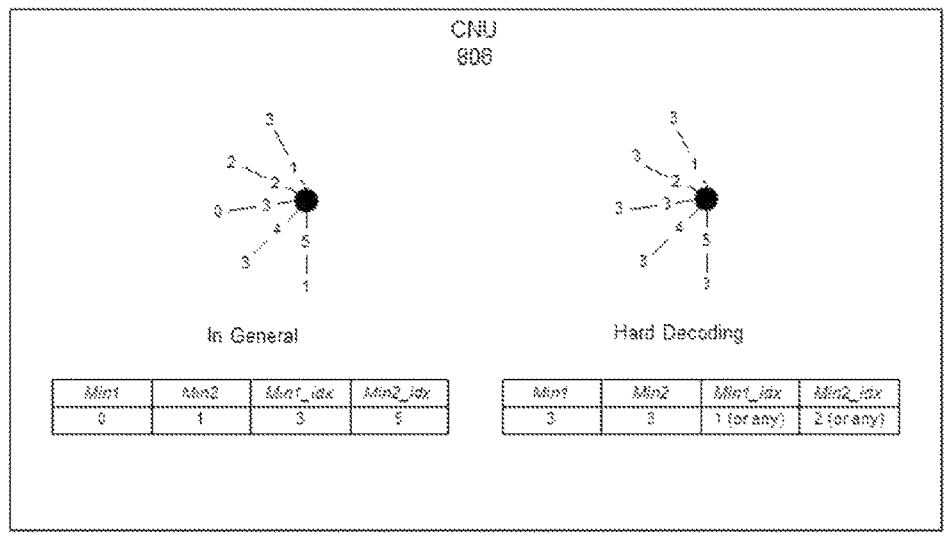
FIG. 8 includes diagrams depicting read values and locations according to aspects of the invention.

To further explain the differences between soft reads and hard reads, as well as minimum magnitudes and locations, the diagrams of FIG. 8 are described below. In examples of a soft read from a NAND 800, the values returned include both a magnitude and a sign. In the example shown where the values are within the range of 3, the soft read 800 may return a value of 3, 2, 1, 0, −1, −2, or −3. In contrast, with a single hard read from the NAND 802, the magnitudes read during a hard read will be the same and only the sign may vary. Thus, the magnitudes will be constant, and the sign ill either be + or − across all entries.

Referring to the general min-sum LDPC decoder described above and with the example BNU unit 804 shown, in a first iteration, the Lch, for example, includes 5 locations, 1-5. In the first iteration, all values are 0. However, in the second iteration, or, in other words, in a hard decoding, each location includes a value of the same magnitude, and the variance will be dependent on the sign of the values. In some embodiments, each location will have the same sign (e.g., either + or −).

In another example, a CNU unit 806 is shown. In general situations, on the left side of the diagram (e.g., for soft decoding), various values are read at different positions. The Min1 is 0, and the location of Min1 (e.g., Min1_idx) is 3. The Min2 is 1, and the location of Min2 (e.g., Min2_idx) is 5.

However, on the right of CNU 806, in examples of hard decoding, each location has the same magnitude of 3, and each location has the same sign (positive). Thus, Min1 is 3 and Min2 is 3, and the locations of Min1 and Min2 can actually be represented by any of the locations 1, 2, 3, 4, or 5.

Utilizing these properties that occur during hard decoding and at the first iteration, and the fact that no error correction is performed during the first iteration of min-sum decoding, the throughput of a min-sum decoder can be increased as is disclosed below.

Figure 9:
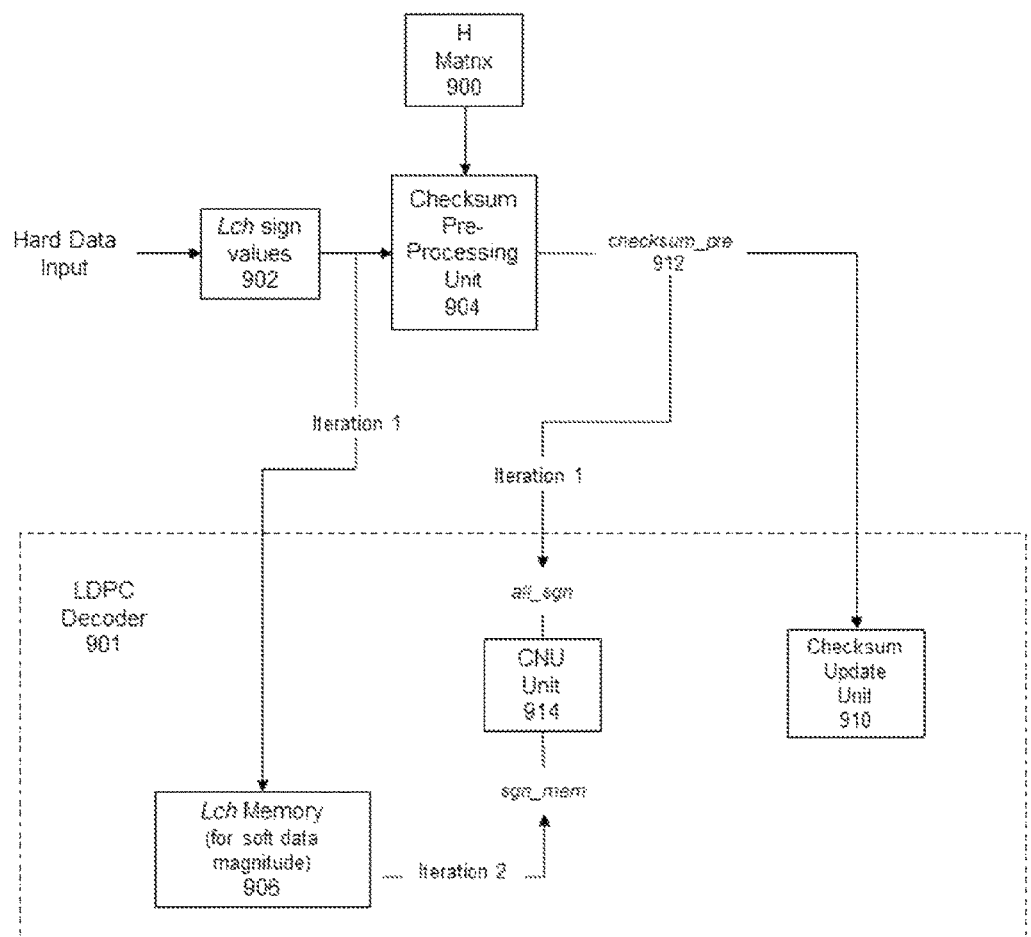
FIG. 9 is a diagram of a process in an iteration of decoding in accordance with aspects of the invention.
Figure 10:
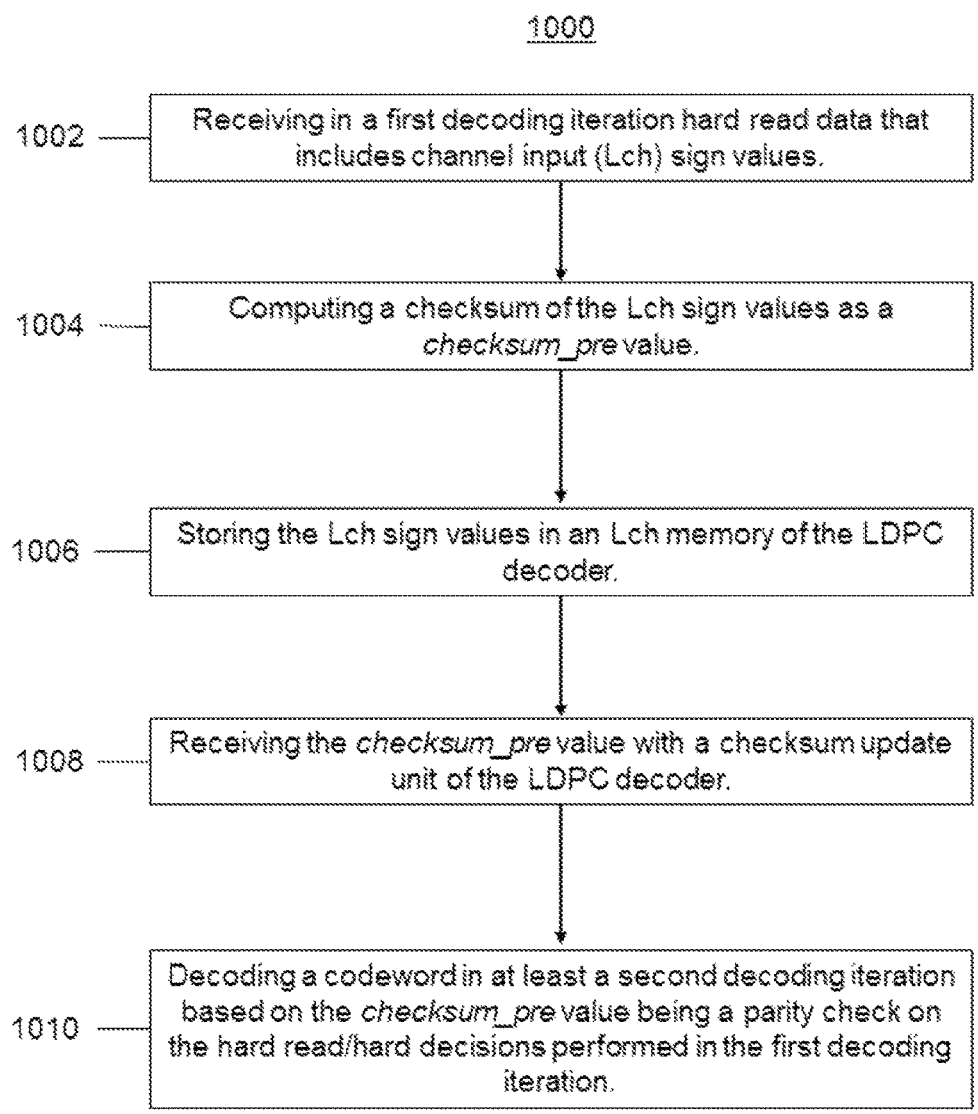
FIG. 10 is a flowchart of steps in a process for decoding according to aspects of the invention.
Figure 11:
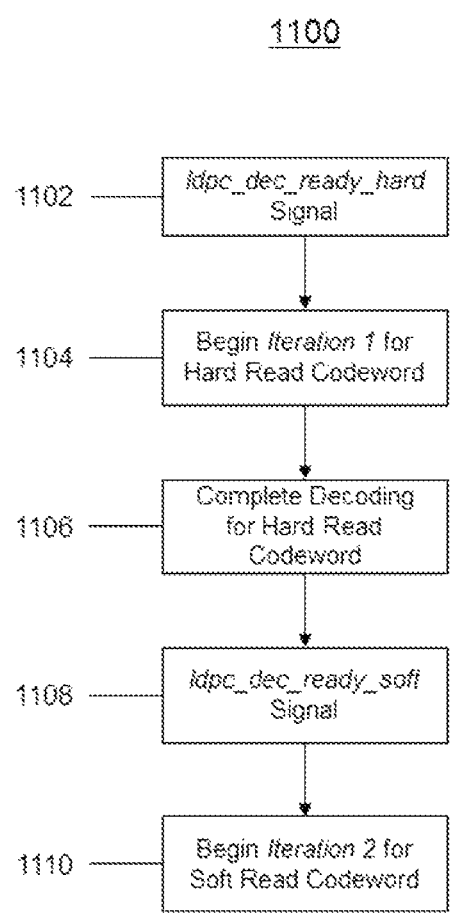
FIG. 11 is a flowchart of steps in a process for decoding according to aspects of the invention.

Referring to FIGS. 9, 10, and 11, systems, devices, methods and processes for improving throughput of memory devices with min-sum decoders are disclosed. FIG. 9 is a flowchart/system 90 diagram showing a decoding process generally through a first iteration of min-sum decoding. FIG. 10 is a flowchart 1000 of steps for improving throughput. FIG. 11 is a flowchart 1100 of steps in initiating the processes mechanically in devices.

Notable in min-sum decoding (e.g., VSS min-sum decoding), the first iteration of the min-sum decoding does not perform any error correction. For hard data input, only the checksum during the first iteration needs to be computed. The (min1, min2, min1_idx, min2_idx) values are the same for all checks at the end of the first iteration and can be initialized. The all_sgn value for each check node is the same as that of the checksum. The sign of check to bit messages (Lcb) for the second iteration can be computed using all_sgn and the sign of input data only. Thus, most of the min-sum decoder hardware is idle during the first iteration for hard data input. Therefore, the checksum computation logic can be replicated and the registers and memory can be shared with the min-sum decoder. This can effectively pipe-line the first iteration of min-sum decoders which can be used only from the second iteration that involves actual error correction, thereby increasing its effective throughput.

Regarding the estimated area and throughput increases, in some embodiments, the area of a dual decoder may be about 850K gates. The estimated area for the logic may be about 40K gates. The estimated area increase may be about 5%. The pipeline iteration disclosed herein saves one decoding iteration on every codeword. Thus, the estimated throughput increase at an average of 3.2 iterations per codeword is 3.2/2.2, or roughly about 45%. Areas for the decoder and logic, as well as other average iterations and throughput performance will vary according to various devices and systems used. However, the methods, systems, devices and processes disclosed herein may be utilized across various systems with varying areas and average iterations as will be understood by those of skill in the art from the disclosure herein.

Referring back to FIGS. 9 and 10, at step 1002, during a first decoding iteration, hard read data is received. The hard read data includes channel input (Lch) soft values 902. In a hard read, Lch values have only 1 bit input for the sign. The magnitudes are all the same, being a constant and thus, there is no need to store the magnitude. Compared to a soft read which requires 3 bits, 2 bits of the Lch memory are not used for hard reads.

For the bit node update unit, the only values that are available from the NAND during the first iteration are the Lch values. Thus, the Lcb values for the first decoding iteration are zero, and the bit to check values Lbc are all the same magnitude and have the sa me sign as the Lch. Therefore, no correction on the input data takes place.

As such, the check node inputs (Lbc) are all of the same magnitude and their signs are the same as the Lch. Therefore, the all_sgn value depends on only the sign of the Lch. Min1_idx and Min2_idx can be chosen as for example 0 and 1 (for convenience, but as discussed above, and valid location value can be used) since all the input magnitudes are the same.

To separate out the processes, the LDPC decoder may be configured to handle decoding during at least the second iteration up and until the final iteration. The first decoding iteration may be handled by a pre-processing check sum unit 904.

At step 1004, the checksum of the Lch sign values are computed as a checksum_pre value. The checksum_pre 912 may be computed/calculated by the checksum pre-processing unit by taking an XOR of the hard data and conducting a parity check with the parity H matrix 900. When the LDPC decoder 901 is decoding a codeword (such as codeword 0 or CW0) a new codeword (codeword 1 or CW1) is input into the system. The XOR computed is small compared to the actual decoder (LDPC decoder 901) area.

At step 1006 the Lch sign values are stored in an Lch memory of the LDPC decoder. The LDPC decoder 901 may be configured with an Lch memory 906. The Lch memory 906 may be configured to store soft data magnitudes, but, during the first iteration of decoding, since less data bits are used, the Lch memory 906 may be used to store the Lch sign values 902 in the free memory.

At step 1008, a checksum update unit may receive the checksum_pre value. For example, the LDPC decoder 901 may include a checksum update unit 910 that is configured to receive the checksum_pre value 912 that is computed by the checksum pre-processing unit 904. In further iterations, the checksum update unit 910 may be configured to compute checksums (e.g., XORs) to determine whether a codeword has converged and decoding can be stopped.

At step 1010, a codeword is decoded in at least a second decoding iteration based on the checksum_pre value being a parity check on the hard read/hard decisions performed to the first decoding iteration. Step 1010 will be described in more detail below.

Once the LDPC decoder 901 is available to begin decoding CW1 decoding of CW0 has converged and the first decoding iteration of CW1 has completed), the second decoding iteration can begin. First, the checksum_pre value may be copied into the all_sgn value of the CNU 914 and the checksum update unit 910 (as mentioned at step 1008), since these values are the same after the first decoding iteration. Next, Min1 and Min2 may be initialized to a constant value (e.g., a register value that is programmable), while Min1_idx may be initialized to 0 and Min2_idx may be initialized to 1.

Since no values were written into the sgn_mem value of the CNU 914 during the first iteration by observing that the value of sgn_mem is the same as the Lch, the sgn_mem value may be substituted in the second decoding iteration with the Lch memory value, such as the Lch values stored in the Lch memory 906. This allows the decoding to engage in the activities of the first iteration disclosed above while setting the necessary stored values so the LDPC decoder 901 can proceed to the second decoding iteration as though data was previous generated and stored.

Thus, if the decoder converges in the middle of the second iteration, the output of the decoder is the combination of the hard decision of bits that are processed and Lch values that are not processed (since no errors were present in this portion).

If a $3^{rd}$ iteration is needed, all the values are in place in the corresponding memories and registers and are identical to normal processing.

While VSS min-sum LDPC decoding requires Min1_idx, Min2_idx, various other min-sum decoders may only require a Min1_idx but the same substitutions can be applied and the processes disclosed above may be generalized.

At FIG. 11, a flowchart 1100 of steps for signal initiation is shown. The LDPC decoder may require an interface change as it may be a drop-in replacement for current decoders. An additional signal may aid with this integration. Since the invention disclosed above uses a soft data buffer of the LDPC decoder, the existing codewords in the decoder should complete decoding before a soft read codeword can be accepted.

Thus, at step 1102, a ldpc_dec_ready_hard signal is received, indicating that the decoder is ready to accept a hard read codeword. At step 1104, iteration 1 for the hard read codeword may begin. At step 1106, the decoding for the hard read codeword finishes. At step 1108, a ldpc_dec_ready_soft signal is received, indicating that the decoder is ready to accept a soft read codeword. At step 1110, iteration 2 for the soft read codeword may begin.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A memory system, comprising:
a memory device; and
a processor in communication with, and configured to control, the memory device, wherein the memory device includes:
a memory storage; and
a read processor coupled with the memory storage, wherein the read processor includes a pre-processing checksum unit and a low-density parity-check (LDPC) decoder that share registers and memory,
the pre-processing checksum unit configured to, during a first decoding iteration:
receive hard read data including channel input (Lch) sign values, wherein the hard read data corresponds to data read from the memory storage;

compute a checksum of the Lch sign values and conduct a parity check, as a checksum_pre value; and
output the checksum_pre value to the LDPC decoder;
the LDPC decoder including an Lch memory and a checksum update unit, the LDPC decoder configured to,
during the first decoding iteration:
store the checksum_pre value received from the pre-processing checksum unit in the Lch memory of the LDPC decoder;
receive, by the checksum update unit, the checksum_pre value; and
pipeline the checksum_pre value for a second decoding iteration, wherein the LDPC decoder does not perform error correction during the first decoding iteration; and
in at least the second decoding iteration,
decode a codeword, using the registers and memory shared with the pre-processing checksum unit, based at least in part on the computed and received checksum_pre value, which includes the parity check on the hard read data operations performed by the pre-processing checksum unit in the first decoding iteration; and
update the checksum value, using the checksum update unit, for a next decoding iteration when the second decoding iteration fails; and
return the decoded codeword when the second decoding iteration is successful.

2. The memory system of claim 1, wherein the LDPC decoder further includes a check node update (CNU) unit configured to store the Lch sign values stored in the Lch memory as a sgn_mem value during the second decoding iteration.

3. The memory system of claim 1, wherein the LDPC decoder further includes a check node update (CNU) unit configured to receive the checksum_pre value during the first decoding iteration and store the checksum_pre value as an all_sgn value.

4. The memory system of claim 1, wherein the LDPC decoder comprises a min-sum LDPC decoder.

5. The memory system of claim 1, wherein the LDPC decoder further includes a check node update (CNU) unit configured to initialize a minimum read value field and a minimum read value location field at the beginning of the second decoding iteration.

6. The memory system of claim 1, wherein the LDPC decoder is available for decoding from the second decoding iteration to the final decoding iteration.

7. A method, comprising:
receiving, with a pre-processing checksum unit of a read processor of a memory device, hard read data including channel input Lch sign values, wherein the hard read data corresponds to data read from a memory storage of the memory device;
computing, using the pre-processing checksum unit, a checksum of the Lch sign values and conducting a parity check, as a checksum_pre value;
outputting the checksum_pre value to a low-density parity-check (LDPC) decoder of the read processor;
during a first decoding iteration:
storing, by the LDPC decoder, the checksum_pre value received from the pre-processing checksum unit in a Lch memory of the LDPC decoder;
receiving, by a checksum update unit of the LDPC decoder, the checksum_pre value; and
pipelining, by the LDPC decoder, the checksum_pre value for a second decoding iteration, wherein the LDPC decoder does not perform error correction during the first decoding iteration; and
in at least the second decoding iteration,
decoding, using the LDPC decoder and registers and memory shared by the LDPC decoder and the pre-processing checksum unit, a codeword based at least in part on the computed and received checksum_pre value, which includes the parity check on the hard read operations performed by the pre-processing checksum unit in the first decoding iteration; and
update the checksum value, using the checksum update unit, for a next decoding iteration when the second decoding iteration fails; and
returning the decoded codeword when the second decoding iteration is successful.

8. The method of claim 7, further comprising storing, with a check node update unit of the LDPC decoder, the Lch sign values stored in the Lch memory as a sgn_mem value during the second decoding iteration.

9. The method of claim 7, further comprising receiving, with a check node update unit of the LDPC decoder, the checksum_pre value during the first decoding iteration and storing the checksum_pre value as an all_sgn value.

10. The method of claim 7, wherein the LDPC decoder comprises a min-sum LDPC decoder.

11. The method of claim 7, further comprising initializing, with a check node update unit of the LDPC decoder, a minimum read value field and a minimum read value location field at the beginning of the second decoding iteration.

12. The method of claim 7, wherein the LDPC decoder is available for decoding from the second decoding iteration to the final decoding iteration.

13. A memory device, comprising:
a memory storage; and
a read processor coupled with the memory storage, wherein the read processor includes a pre-processing checksum unit and a low-density parity-check (LDPC) decoder that share registers and memory, the pre-processing checksum unit configured to, during a first decoding iteration:
receive hard read data including channel input (Lch) sign values, wherein the hard read data corresponds to data read from the memory storage;
compute a checksum of the Lch sign values and conduct a parity check, as a checksum_pre value; and
output the checksum_pre value to the LDPC decoder;
the LDPC decoder including an Lch memory and a checksum update unit, the LDPC decoder configured to,
during the first decoding iteration:
store the checksum_pre value received from the pre-processing checksum unit in the Lch memory of the LDPC decoder;
receive, by the checksum update unit, the checksum_pre value;
pipeline the checksum_pre value for a second decoding iteration, wherein the LDPC decoder does not perform error correction during the first decoding iteration; and
in at least the second decoding iteration,
decode a codeword, using the registers and memory shared with the pre-processing checksum unit, based at least in part on the computed and received checksum_pre value, which includes the parity check on the hard read data operations performed by the pre-processing checksum unit in the first decoding iteration; and update the checksum value, using the checksum update unit, for a next decoding iteration when the second decoding iteration fails; and return the decoded codeword when the second decoding iteration is successful.

14. The memory device of claim 13, wherein the LDPC decoder further includes a check node update (CNU) unit configured to store the Lch sign values stored in the Lch memory as a sgn_mem value during the second decoding iteration.

15. The memory device of claim 13, wherein the LDPC decoder further includes a check node update (CNU) unit configured to receive the checksum_pre value during the first decoding iteration and store the checksum_pre value as an all_sgn value.

16. The memory device of claim 13, wherein the LDPC decoder comprises a min-sum LDPC decoder.

17. The memory device of claim 13, wherein the LDPC decoder further includes a check node update (CNU) unit configured to initialize a minimum read value field and a minimum read value location field at the beginning of the second decoding iteration.

18. The memory device of claim 13, wherein the LDPC decoder is available for decoding from the second decoding iteration to the final decoding iteration.

* * * * *